(12) United States Patent
Burkhardt et al.

(10) Patent No.: US 6,570,320 B1
(45) Date of Patent: May 27, 2003

(54) DEVICE FOR SHAPING AN ELECTRON BEAM, METHOD FOR PRODUCING SAID DEVICE AND USE THEREOF

(75) Inventors: Klaus Burkhardt, Kraichtal (DE); Wolfgang Eckhardt, Karlsruhe (DE); Silvia Gohlke, München (DE); Ruth Männer, Oberpframmern (DE); Wolfram Wersing, München (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/701,894

(22) PCT Filed: Jun. 1, 1999

(86) PCT No.: PCT/DE99/01610

§ 371 (c)(1),
(2), (4) Date: Dec. 4, 2000

(87) PCT Pub. No.: WO99/63566

PCT Pub. Date: Dec. 9, 1999

(30) Foreign Application Priority Data

Jun. 3, 1998 (DE) ........................................ 198 24 783

(51) Int. Cl.[7] ............................................. H01J 63/04
(52) U.S. Cl. ........................................ 313/495; 313/521
(58) Field of Search .................................. 313/495, 414, 313/432, 439, 450, 308, 336, 519, 521; 438/165, 109; 361/321.1, 321.2; H01J 63/04

(56) References Cited

U.S. PATENT DOCUMENTS 2,533,790 A   12/1950   Grivet .................... 250/49.5

(List continued on next page.)

FOREIGN PATENT DOCUMENTS

| DE | 275 156 A3 | 1/1990 | ............ C03C/8/24 |
|----|------------|--------|----------------------|
| DE | 3837300 A1 | 5/1990 | ............ H05K/3/34 |
| DE | 92 13 965.5 | 4/1993 | ............ H01J/37/12 |
| DE | 44 19 764 C1 | 12/1995 | ............ F27D/3/12 |
| DE | 196 46 369 A1 | 5/1998 | ............ H05K/1/09 |
| EP | 0 351 444 A1 | 1/1990 | ............ H01J/9/02 |
| EP | 0 388 980 | 9/1990 | ........... H01L/27/01 |
| EP | 0 843 335 A1 | 5/1998 | ............ H01J/37/12 |

OTHER PUBLICATIONS

Wilcox, Sr., et al., "The Multilayer Ceramic Integrated Circuit (MCIC) Technology: Opportunities and Challenges", pp. 17–23.

Bauer et al., "Realization of LTCC–Multilayer with Special Cavity Applications", pp. 659–664.

*Primary Examiner*—Don Wong
*Assistant Examiner*—Trinh Vo Dinh
(74) *Attorney, Agent, or Firm*—Harness, Dickey & Pierce, P.L.C.

(57) ABSTRACT

The invention is directed to an extremely low-capacitance device for shaping an electron beam. The device is based on a ceramic body having a monolithic multi-layer structure. The manufacture of the ceramic body ensues with the assistance of LTCC technology, whereby this method is designationally modified. The body is constructed of pre-sintered ceramic layers whose lateral shrinkage is suppressed. The through apertures of the electrodes for the electron beam are thus arranged exactly coaxially, and the tolerances of the electrode dimensions are decoupled from the shrinkage during sintering. The electron beam of an electron gun is focused and the intensity thereof is modulated with the assistance of such a device.

20 Claims, 6 Drawing Sheets

U.S. PATENT DOCUMENTS

| | | | |
|---|---|---|---|
| 3,935,500 A | * | 1/1976 | Oess et al. .................. 313/495 |
| 4,870,539 A | * | 9/1989 | Chance et al. ....... 252/62.3 BT |
| 4,945,283 A | * | 7/1990 | Van Der Heijden et al. ............. 313/450 |
| 5,367,218 A | | 11/1994 | Comby ................ 313/105 CM |
| 5,443,786 A | | 8/1995 | Yokoyama et al. ............ 419/9 |
| 5,534,743 A | | 7/1996 | Jones et al. ................. 313/309 |
| 5,617,865 A | * | 4/1997 | Palczewska et al. ........ 600/459 |
| 5,657,199 A | * | 8/1997 | Devoe et al. ................ 361/303 |
| 5,661,363 A | * | 8/1997 | Iguchi et al. ............... 313/412 |
| 5,744,898 A | * | 4/1998 | Smith et al. ................. 310/334 |
| 5,855,995 A | * | 1/1999 | Haq et al. ................... 174/256 |
| 6,025,609 A | * | 2/2000 | Quick ......................... 257/49 |
| 6,041,496 A | * | 3/2000 | Haq et al. ................. 156/89.11 |
| 6,146,743 A | * | 11/2000 | Haq et al. ................... 174/257 |

* cited by examiner

DEVICE FOR SHAPING AN ELECTRON BEAM, METHOD FOR PRODUCING SAID DEVICE AND USE THEREOF

BACKGROUND OF THE INVENTION

Electron tubes are often employed in technology, thus, for example, in electron microscopes or monitors. The object of many developments in the field of electron tubes is to improve the resolution of the devices wherein these tubes are employed. The resolution of such a device is dependent on, among other things, the electron gun that is integrated in the electron tube of the device. The electron gun generates an electron beam. It comprises an electron source and a suitable arrangement of electrodes. For example, a heated cathode that emits electrons excited by thermal energy comes into consideration as electron source. The electrodes serve as diaphragms of the focussing, of the intensity modulation and, potentially, of the deflection of the electron beam.

According to the current state of the art, electron guns of high-resolution monitors contain the following structure: the cathode and a first grid electrode are combined in a metal pot that is fused into a glass mount of the electron tube. Two further grid electrodes that are likewise fused into the glass mount are attached in a propagation direction of the electron beam.

In order to achieve an extremely high resolution of the monitor, the extremely fine through apertures of the grid electrodes or, respectively, electrode plates for electron focusing must be exactly circular and arranged exactly coaxially relative to one another. Over and above this, an extremely low-capacitance structure of the electrode arrangement is a basic pre-requisite for achieving a.high signal bandwidth.

These demands have not yet been satisfactorily met by the conventional tube technology. For example, the coaxial alignment of the through apertures for the electron beam is possible to only a limited extent due to the separate fusing of the electrodes in glass.

An alternative solution proceeds from U.S. Pat. No. 5,661,363. The apparatus disclosed here for shaping an electron beam is a ceramic body in monolithic multi-layer structure having at least electrode ceramic layer that comprises at least one through aperture for the electron beam. The electrode ceramic layer is composed of ruthenium oxide, an electrically conductive ceramic material. The electrode ceramic layer itself is thereby an electrode with whose assistance the electron beam can be shaped. In one embodiment, a plurality of electrode ceramic layers and insulating ceramic layers for insulation of the electrode ceramic layers are arranged in alternation in the propagation direction of the electron beam. Since a whole electrode ceramic layers respectively forms an electrode, a low-capacitance apparatus is difficult to achieve.

SUMMARY OF THE INVENTION

An object of the invention is to provide a low-capacitance means for shaping an electron beam and a method for the manufacture thereof.

This object is achieved by an apparatus for shaping an electron beam, composed of a ceramic body in monolithic multi-layer structure having at least one electrode ceramic layer that comprises at least one through aperture for the electron beam and at least one electrode arranged at the through aperture, the electrode ceramic layer comprises glass ceramic and the electrode is composed of an elementary metal.

In a preferred embodiment, the electrode is annularly arranged around the through aperture. At least two electrodes are successively arranged along the propagation direction of the electron beam. The body may have at least one insulating ceramic layer that comprises a through aperture for the electron beam. A plurality of electrode ceramic layers and insulating ceramic layers of the body may be arranged in alternation along the propagation direction of the electron beam. In one example, one electrode is electrically insulated from at least one second electrode. Further, one electrode is electrically conductively connected to at least one second electrode. Specifically, the body comprises at least one electrical contacting composed of said metal. The metal comprises at least one substance from the group of gold, copper, molybdenum, palladium, platinum, silver and/or tungsten.

An exemplary embodiment provides that a plurality of electrodes and electrical contactings are arranged such that a capacitance arrangement is formed whose capacitances lie below 3 pF. The body is connected by glass solder to a cathode for generating the electron beam.

The invention also relates to employment of an apparatus according to the foregoing for the intensity modulation and focusing of the electron beam.

A method for the manufacture of an apparatus includes:

at least two ceramic layers each having at least one through aperture for the electron are fabricated from a green ceramic film containing a binding agent, whereby at least one of the ceramic layers is fashioned as electrode ceramic layer;

the ceramic layers are stacked such upon employment of a first stacking device that the through apertures are arranged above one another; and the ceramic layers are sintered to form the body under single-axis pressure and the sintering temperature of the ceramic material employed.

Preferably, for fabricating the ceramic layer, at least one through aperture is produced in the green ceramic film;

at least two green ceramic films are stacked such upon employment of a second stacking device that the through apertures are arranged above one another;

the stacked green ceramic films are laminated to form a composite;

the composite is freed of the binding agent at elevated temperatures; and the composite is pre-sintered to a ceramic layer at a temperature that lies under the sintering temperature of the ceramic material employed.

The method for fabricating the ceramic layer includes the manufacture of an electrical through-contacting in the ceramic layer, whereby at least one contacting opening is produced in at least one green ceramic film, said contacting opening being filled with electrically conductive material. In a preferred development, electrically conductive material is applied on a surface of the ceramic layer following the pre-sintering for fabricating an electrode ceramic layer. Specifically, electrically conductive material is applied on the surface of at least one green ceramic film for fabricating an electrode ceramic layer. Exemplary embodiments of the method provide that at least one substance from the group of gold, copper, molybdenum, palladium, platinum, silver and/or tungsten is selected as electrically conductive material. For manufacturing the ceramic layer, the green ceramic films are stacked such on top of one another that the uppermost and the lowest green ceramic film of the composite comprise ceramic material whose sintering temperature lies above that of the ceramic material that the green ceramic films lying therebetween in the composite comprise; and the ceramic material sintering at the higher temperature is removed after the pre-sintering. In one embodiment, a green ceramic film that comprises aluminum oxide is employed as the first and last green ceramic film in the stacking.

According to the first mentioned embodiment, an apparatus for shaping an electron beam composed of a ceramic body in a monolithic multi-layer structure having at least one electrode ceramic layer is provided that has at least one through aperture for the electron beam and at least one electrode arranged at the through aperture. This apparatus is characterized in that the electrode ceramic layer comprises glass ceramic and the electrode is composed of an elementary metal.

This apparatus, which is referred to below as an electrode arrangement as well, comprises, for example, three electrodes and serves the purpose of focusing the electron beam in an electron gun.

The ceramic body is preferably shaped as a flat, round cylinder and has at least one through aperture through which the electron beam can be guided.

The electron arrangement is monolithically constructed of a plurality of ceramic layers. The individual ceramic layers are preferably differently constructed and thus also assume different functions. Electrode ceramic layers comprise electrodes with appertaining electrical contactings, for example in the form of interconnects. The electrodes are thereby attached to the through aperture, preferably at the surface of the electrode ceramic layer. Insulating ceramic layers serve the purpose of insulating the electrode ceramic layers from one another and arranging these at a defined spacing from one another. Electrode ceramic layers and insulating. ceramic layers are preferably arranged in alternation in the propagation direction of the electron beam.

The electrical contactings enable the definition of the potential of the electrodes. The interconnects are preferably arranged in the inside of the ceramic body.

Each of the through apertures of the electrode ceramic layers is, in particular, exactly circular. Each electrode is preferably shaped as a ring of electrically conductive material. It is especially advantageous when the ring is closed. However, it can also be subdivided into individual electrodes. The inside diameter of the ring preferably corresponds to the diameter of the through aperture of the ceramic at the corresponding location. These diameters, however, can also deviate from one another. In particular, deviations from an exactly circular shape can be desired when distortions of the electron beam are compensated, these deriving from the overall structure of the electron tube in the electron beam generation. For example, the through aperture and the electrode ring of an electrode ceramic layer can be elliptically shaped.

The compensation of distortions that has been addressed also succeeds, for example, in that different potential is applied to two or more electrodes of a subdivided electrode ring of an electrode ceramic layer.

Sintering glass the ceramic particularly comes into consideration as ceramic material, this, for example, containing aluminum oxide, boron oxide or earth alkali oxide. The composition of the glass ceramic is thereby selected such that the ceramic becomes denser in the temperature range of the melting point of the metal employed. In order to inventively achieve an optimally low-capacitance structure of the electrode arrangement, the material of the ceramic body—over and above this—must comprise an optimally low, relative dielectric constant (for example, $6 \leq \epsilon \leq 8$).

The electrodes and the contactings are composed of molybdenum, palladium, platinum, silver or tungsten. Other metals such as copper or gold are just as possible, as are alloys of said metals such as, for example, silver/palladium. The interconnects are preferably composed of the same material as the electrodes. Different material, however, is also conceivable.

It is especially advantageous when an electrode ceramic layer has a plurality of electrodes that are successively arranged in the propagation direction of the electron beam. These electrodes can be electrically conductively connected, to one another. In particular, the electrodes can also be electrically insulated from one another. As a result thereof, different potentials can be applied to the electrodes in the electron beam generating process. Such an arrangement replaces the desire of classic tube technology of using conical through apertures for the focusing and intensity modulation of the electron beam.

The electrode arrangement can comprise a plurality of through apertures through which a respective electron beam is conducted. Such an arrangement is used, for example, in color picture tubes having three beam systems. A separate electron beam is generated for each of the three primary colors (for example, blue, yellow, red).

For employment in electron tubes, it is especially advantageous when the electrode arrangement has electrical contactings available to it in the form of through-contactings. An electrical through-contacting, for example, penetrates one or more ceramic layers. For example, two electrodes of an electrode ceramic layer are electrically conductively connected to one another via an electrical through-contacting.

For example, the electrode potentials are defined with the electrical terminal locations that are arranged at the surface of the ceramic body and that are connected to the electrodes via interconnects and/or through-contactings. It is especially advantageous when the electrical through-contactings, interconnects and terminals are arranged such in and/or at the electrode arrangement that an optimally low-capacitance structure results. This means that the electrical contactings that are supplied with different potential are optimally decoupled.

Additional control functions of an electron gun can be integrated in an especially simple way in the ceramic electrode arrangement with the assistance of electrical terminal locations and/or contactings. For example, the drive of the cathode can ensue via such electrical connections. It is especially advantageous when, in this case, the cathode is connected to the electrode arrangement, for example via a ceramic base and with glass solder. As a result thereof, additional holes and lines in the housing of the cathode are superfluous. The manufacture of an electron gun is thereby substantially simplified. Moreover, possible leaks are avoided that could deteriorate the evacuation of the electron tube.

An electrode arrangement disclosed here can be integrated in glass in an electron gun by fusing in a traditional way. It serves the purpose of intensity modulation and focusing of the electron beam. It is especially advantageous when the electrode arrangement, as described above, is directly connected to the electron source.

Additionally, further component parts of an electron tube can be connected via glass solder to the electrode arrangement such as, for example, the principal lens of an electron tube.

The manufacture of a disclosed electrode arrangement in monolithic multi-layer structure preferably ensues in LTCC (low-temperature co-fired ceramic) technology. This technology is suitable for the manufacture of monolithic ceramic multi-layer systems with integrated, passive components (see, for example, D. L. Wilcox, Proc. 1997 ISHM Philadelphia, pages 17–23). This technology is particularly suited for ceramic component parts into which material such as gold, copper or silver having extremely good electrical conductivity is to be integrated.

The critical method steps of LTCC technology are:

Manufacture of a green ceramic film containing an organic binder, this comprising the glass ceramic.

Producing openings in the green ceramic film that are intended for contacts.

Filling the openings with electrically conductive material.

Printing the green ceramic film with electrical conductor structures.

Stacking the green ceramic films on top of one another and laminating them to form a composite.

Sintering the composite to form a body having monolithic multi-layer structure.

Due to the densification of the ceramic material during the sintering process, a volume decrease of 10–20% occurs. If the LTCC technology or a similar method were utilized in a known way for manufacturing an electrode arrangement, it would particularly be lateral tolerances that would have to be accepted, these being unacceptable in view of the demands made of a high-resolution monitor. The LTCC method is therefore modified.

Pre-sintered ceramic layers are stacked on top of one another and sintered together in the manufacture of the electrode arrangement. The pre-sintering ensues at a temperature that lies below the sintering temperature of the ceramic material employed. The shrinkage process of the ceramic is merely ended after the pre-sintering. As a result thereof, the influence of the shrinkage of the ceramic on the occurring tolerances is suppressed.

As a result of this modification of the LTCC technology, longitudinal tolerances of the electrode dimensions of ±5 μm can be achieved. Over and above this, the coaxial alignment of the grids is considerably improved. However,it is particular an extremely low-capacitance structure of the focusing unit of up to 1 pF that can be realized with the assistance of this technology.

In addition to these advantages over the prior art, the invention, with the method on the basis of the LTCC technology, offers a cost-beneficial, easily modified and automated manufacturing process of the ceramic electrode arrangement. The LTCC technology can be very easily employed in a multi-up.

The manufacture of a green ceramic film ensues according to known methods. The green ceramic film is tailored to the desired shape by cutting or punching, this, for example, being potentially the direct shape of the electrode arrangement as employed, for example, in an electron tube. Or, the form is selected that is customized for further-processing of the green ceramic film (for example, in multi-up).

The apertures or, respectively, holes in the green ceramic film are produced by punching in an especially simple way. Other methods for structuring green ceramic films such as, for example, photolithography or the production of apertures with the assistance of laser emission can likewise be employed here.

In view of the electrode arrangement, at least one through opening is produced in the green ceramic film through which the electron beam is conducted in the electron beam generating process. A plurality of such through openings come into consideration when a plurality of electron beams are to be manipulated with the assistance of the electrode arrangement (for example, in electron tubes of color monitors).

Additional holes are produced in addition to this through opening that occurs in each green ceramic film. These are selected according to the specific functions that are to be integrated into the electrode arrangement with the corresponding green ceramic film. When, for example, a vertical electrical through-contacting is to be produced through a ceramic layer, all green ceramic films that are stacked on top of one another for the manufacture of the ceramic layer are given a hole at the same position. This hole is filled with metal in a further method step. The stencil printing method is thereby especially advantageous.

In addition to the openings on which the functionality of the electrode arrangement is based, it is especially advantageous to produce additional holes in the green ceramic films, the manufacture of the electrode arrangement being greatly simplified with their systems. Thus, for example, centering holes in the manufacturing process enable an exact superimposed stacking of the green ceramic films. It is especially advantageous to generate hole structures in the green ceramic films that correspond to the shape of the electrode arrangement to be manufactured. Individual, pre-sintered ceramic layers or the complete sintered electrode arrangement can be easily separated from one another with the assistance of these holes.

After the holes have been produced, electrically conductive material is applied onto the surface of the green ceramic film for producing the electrodes and interconnects, whereby green ceramic electrode films arise. The silk-screening method can be especially advantageously applied here. Other methods such as, for example, stencil printing are likewise conceivable. A metal paste is thereby attached to the through opening for the electron beam for the electrode. It is especially advantageous to shape the electrode as a ring, so that the opening and the inner clearance of the ring are arranged above one another. The outside diameter of the ring is selected as small as possible in order to obtain an optimally low-capacitance arrangement. It is especially advantageous to attach a respective electrode to the upper side and underside of the green ceramic film. During the course of the manufacturing method, the two electrodes can be electrically conductively connected or can remain insulated from one another.

The electrodes are connected by applying interconnects, for example with electrical through-contactings. An electrical connection from an electrode to a through-contacting, however, can be delayed until after a green ceramic film with a ring electrode and a ceramic film having a printed interconnect are stacked on top of one another and laminated.

In contrast to the traditional LTCC technology wherein all required green ceramic films are laminated and sintered in common, the green ceramic films here are stacked on top of one another to form smaller composites, are laminated, freed of organic binding agent and sintered to form individual ceramic layers. The sintering ensues at a temperature that lies under the sintering temperature $T_s$ of the ceramic material employed. The temperature difference amounts, for example, to 100 K. In the second step, the pre-sintered ceramic layers wherein different functions are preferably integrated are stacked on top of one another and re-sintered under pressure at the sintering temperature $T_s$ of the ceramic. The pressure that, for example, is produced with a weight load enables the ceramic layers to grow planarly together.

The decisive modification of the LTCC technology is the division of the sintering into two sintering processes. The shrinkage of the ceramic has been nearly ended after the pre-sintering. Accordingly, the ceramic becomes hardly any denser in the second sintering process. As a result thereof, hardly any distortions of the electrode arrangement that could be attributed to different densification of the ceramic occur in the second sintering process.

In addition to the indicated possibility, these distortions can be suppressed by applying a sintering technology that suppresses the lateral shrinkage of a ceramic during sintering. For example, green ceramic films that comprise different ceramic material are thereby sintered together. It is especially advantageous when the uppermost and the lowest green film of a laminated stack of green films contain a ceramic material that exhibits a higher sintering temperature than that of the green films in the inside of the stack. The laminated stack is sintered at the sintering temperature of the inner ceramic material, so that only this material densifies. The non-densifying, outer ceramic material prevents the lateral shrinkage of the inner ceramic material. The densification of the inner ceramic material occurs only perpendicularly relative to the foil planes. Let aluminum oxide be cited as an example for the ceramic material of the outer green ceramic films.

Another possibility of preventing lateral shrinkage is comprised in compelling an oriented densification of the ceramic with single-axis pressure.

After the sintering process, the ceramic layers may have to be post-processed under certain circumstances. Ceramic layers that comprise defined layer thicknesses and exactly planar surfaces are obtained by grinding and/or polishing the surfaces. This is important particularly in view of the coaxial alignment of the through apertures for the electron beam.

The grinding and/or polishing is particularly needed when the sintering technique being considered having the green films that contain different ceramic material is applied. The outer ceramic material must be removed from the surfaces of the ceramic layers before the ceramic layers are stacked on top of one another.

When the surfaces of the pre-sintered ceramic layers are ground, then electrically conductive material must be applied onto the ceramic layers after the grinding depending on the function of the ceramic layer.

The through apertures themselves must likewise be post-processed under certain circumstances in order to adhere to the prescribed tolerances of the electrode dimensions. The post-processing preferably ensues mechanically (for example, by grinding or laser drilling). Other methods such as, for example, photolithography or material erosion with a laser beam can likewise be utilized here.

The stacking of the green ceramic films and of the ceramic layers beneficially ensues in a respective stacking device. The stacking device, for example, is shaped such that the films or, respectively, layers can be arranged in the device with an exact fit. It is especially advantageous when the device has centering pins available to it that correspond to the centering holes of the ceramic bodies. The green ceramic films or, respectively, ceramic layers can be stacked exactly on top of one another with the assistance of the centering holes and pins. Moreover, this prevents individual layers from slipping laterally during the processing. The, centering of green ceramic films or, respectively, ceramic layers stacked exactly above one another is of critical significance for the coaxial alignment of the electrodes.

The material of which the stacking devices are composed is selected such that no adhesion arises between device and glass ceramic. Over and above this, the material must have a high coefficient of thermal conductivity so that no temperature gradient occurs during the course of the sintering. Silicon carbide is especially suited for this application. Other materials such as, for example, zirconium oxide are likewise conceivable.

A particular advantage derives in that the LTCC technology can be easily applied in multi-up. This means that a plurality of identical structures (for example, 2×2) are produced in a green ceramic film. There are various possibilities for the further-processing: after the lamination of the green ceramic film multi-ups, the overall stack is divided, for example by cutting, into individual, identical sub-stacks that are subsequently sintered separately from one another. Alternatively thereto, the laminated, green ceramic film multi-up can be de-bonded and sintered, whereby the sub-stacks are separated from one another, for example by sawing, after the sintering.

The following procedure is especially advantageous in view of the manufacture of the electrode arrangement: additional hole structures are produced in the green ceramic film in the method step of producing holes. These hole structures are, for example, quadratically arranged on the green ceramic film. The above-described holes or, respectively, hole structures are located in the inside of each square.

The green ceramic film multi-ups are pre-sintered as described above to form a multi-up of ceramic layers. The hole structures make it possible to separate the ceramic layers, for example by breaking them out. The separated, pre-sintered ceramic layers are sintered together during the further course of the process as recited above.

Alternatively thereto, multi-ups of the pre-sintered ceramic layers can be sintered together. It lies at hand here to use the same stacking device that is employed for producing the ceramic layer multi-ups. The separation only ensues after the ceramic layers have been sintered together to form a monolithic ceramic body.

The sintering of detached ceramic layers, however, has the advantage that shrinkage tolerances and inhomogeneities can be intercepted significantly more easily. Moreover, it is possible to separate faulty parts out before the further-processing. A low reject rate and a high process dependability are connected therewith.

BRIEF DESCRIPTION OF THE DRAWINGS

An inventive electro-arrangement and the method for the manufacture thereof are presented below on the basis of an exemplary embodiment and the appertaining Figures. The figures do not represent to-scale illustrations of the indicated articles.

DETAILED DESCRIPTION OF THE PREFERRED EMBODIMENTS

The subject matter is an extremely low-capacitance device for shaping an electron beam. The device is composed of a ceramic body 11 having a monolithic multi-layer structure. The body contains a through aperture 12 for the electron beam. With the assistance of the grid electrodes 141, 142, 143, which are arranged at the through aperture, the device is utilized in a high-resolution black-and-white monitor tube for intensity modulation and focusing of the electron beam. The electrodes are arranged exactly coaxially relative to one another. The electrode dimensions have tolerances of a maximum of ±5 µm. Low capacitances down to 1 pF are achieved with this structure.

Figure 1:
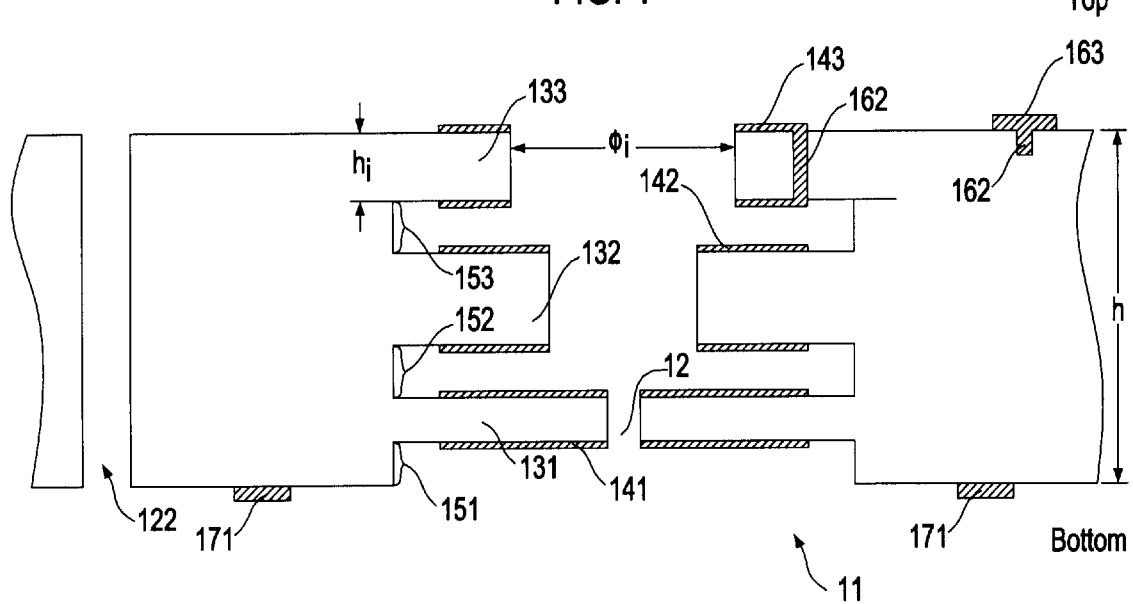
FIG. 1 shows an inventive device in cross-section A—A.
Figure 2:
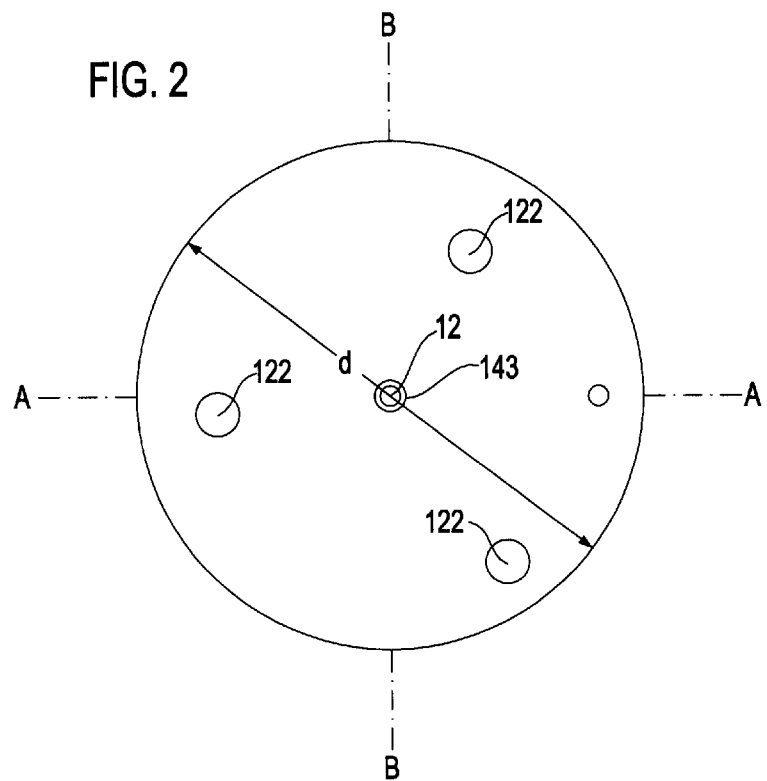
FIG. 2 shows an inventive device from above.
Figure 3:
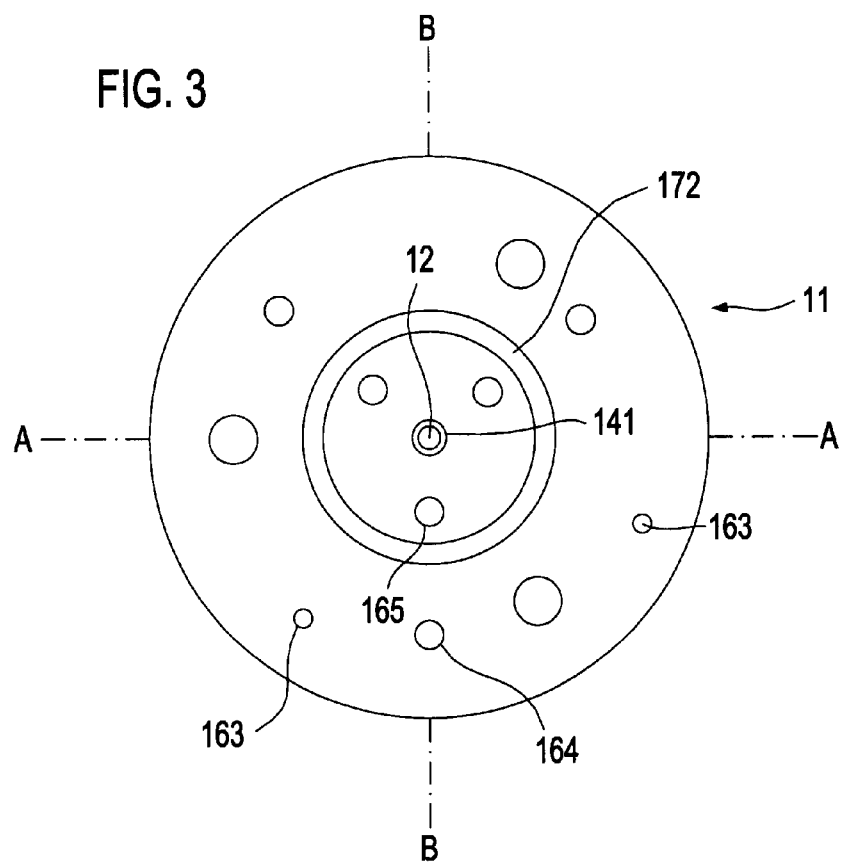
FIG. 3 shows an inventive device from below.
Figure 4:
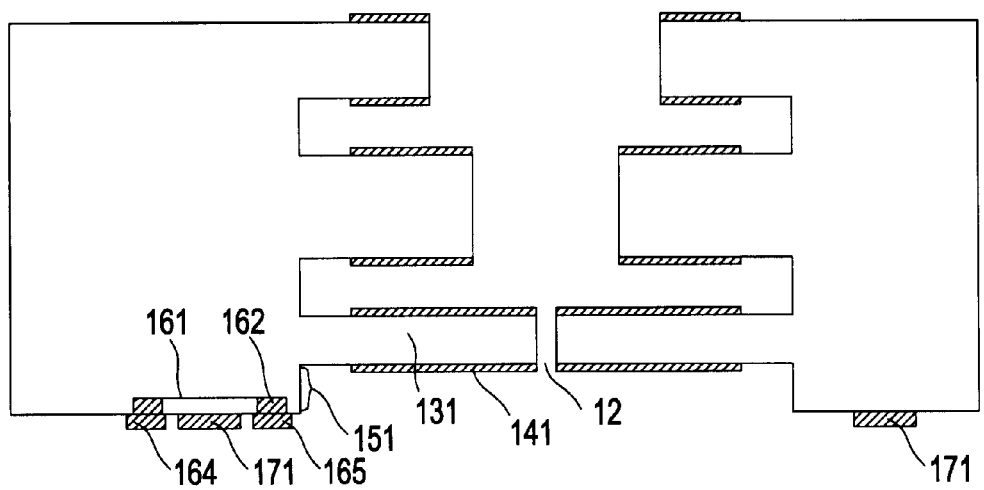
FIG. 4 shows an inventive device in cross-section B—B.

The device can be seen in cross-section through the connecting line A—A in FIG. 1 (see FIG. 2). FIG. 4 shows the same arrangement in cross-section with the connecting line B—B. The arrangement can be seen from above or, respectively, from below in FIGS. 2 and 3.

In the exemplary embodiment, the device is shaped as a flat, round cylinder that is composed of low-sintering glass ceramic ($T_2 850$–$950°$ C.). The diameter of the cylinder is thereby significantly greater than its height (for example, height h=985 µm; diameter d=1–3 cm).

The electrode arrangement comprises a monolithic multi-layer structure. It is constructed of three insulating ceramic layers 151–153 and of three electrode ceramic layers 131–133. Electrode ceramic layers and insulating ceramic layers are arranged in alternation in the propagation direction of the electron beam.

The layer thicknesses $h_i$ of the individual ceramic layers and the diameters θ of the appertaining through apertures of the ceramic layers can, for example, exhibit values that are compiled in the following Table:

TABLE

Layer thickness $h_i$ of the ceramic layers and diameters $Ø_i$ of the through aperture of the ceramic layers.

| Ceramic Layer | 151 | 131 | 152 | 132 | 153 | 133 |
|---|---|---|---|---|---|---|
| $h_i$ [µm] | 100 | 50 | 190 | 300 | 165 | 180 |
| $Ø_i$ [µm] | 1200 | 375 | 1200 | 500 | 1200 | 800 |

Each electro ceramic layer has an electrode directly at the through aperture. Metal rings are thereby attached to the upper side and underside of each electrode ceramic layer, the metal rings being electrically conductively connected to one another via a vertical, electrical through-contacting 162. The diameters of the contactings amount, for example, to 300 µm. The electrodes are shaped as circular rings. The inside diameter of a ring corresponds to the diameter of the ceramic body at the corresponding location. The outside diameter amounts, for example, to 1000 µm.

In a specific development of the invention, the two metal rings of an individual electrode ceramic layer are electrically insulated from one another. Each electrode ceramic layer thus has two electrodes, each of which comprises its own electrical contacting via an interconnect and/or electrical through-contacting.

Via horizontal electrical interconnects 161 and, connected thereto, vertical electrical through-contactings 162, the electrodes are connected to electrical terminal locations 163 in the form of, for example, solder pads that are located at the surface of the electrode arrangement. The interconnects have a diameter of, for example, 100 through 200 µm.

The three interconnects with which the electrodes of the three electrode ceramic layers are connected are decoupled insofar as possible. Viewed in the propagation direction of the electron beam, they are arranged such that they are not congruent. The interconnects of neighboring electrode ceramic layers, for example, describe an angle of 90°.

Three electrical contacts for the drive of a cathode are likewise integrated in the arrangement in the form of terminal locations 164 and 165 at the underside, through-contactings 162 and interconnects 161 in the lowest insulating ceramic layer 151 (FIG. 4).

Gold, copper, molybdenum, palladium, platinum, silver or, respectively, alloys of said metals, for example, come into consideration as materials for the electrodes and the electrical contactings.

Figure 9:
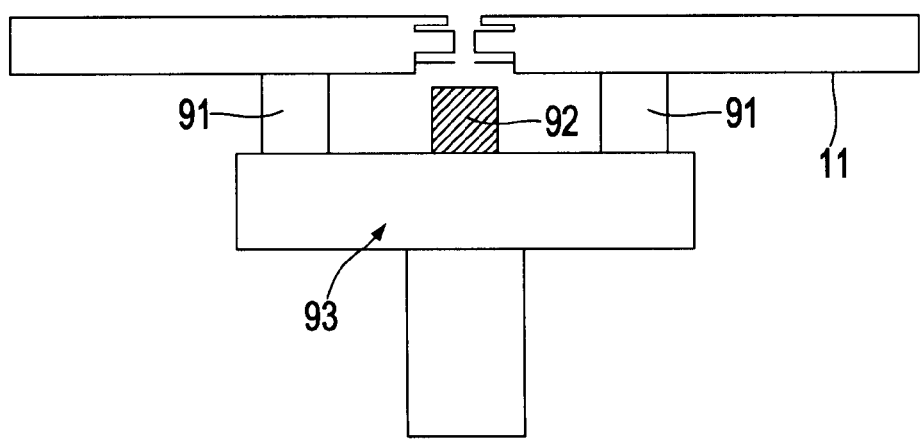
FIG. 9 shows an inventive device that is connected to a cathode.

Such an electrode arrangement can be fused into the glass body of an electron tube. It is especially advantageous to connect the electrode arrangement to a cathode 92 including heating unit 93 via a ceramic base 91 (FIG. 9). The cathode, for example, is attached to the ceramic base 91 by laser welding, the latter being in turn connected to the electrode arrangement via glass solder 172 in the form of a ring.

The individual parts are thereby arranged such relative to one another that the electrical terminals of the cathode are in contact with the terminal locations 165 provided in the electrode arrangement. The cathode, as electron source, is thus driven via this arrangement.

Figure 5:
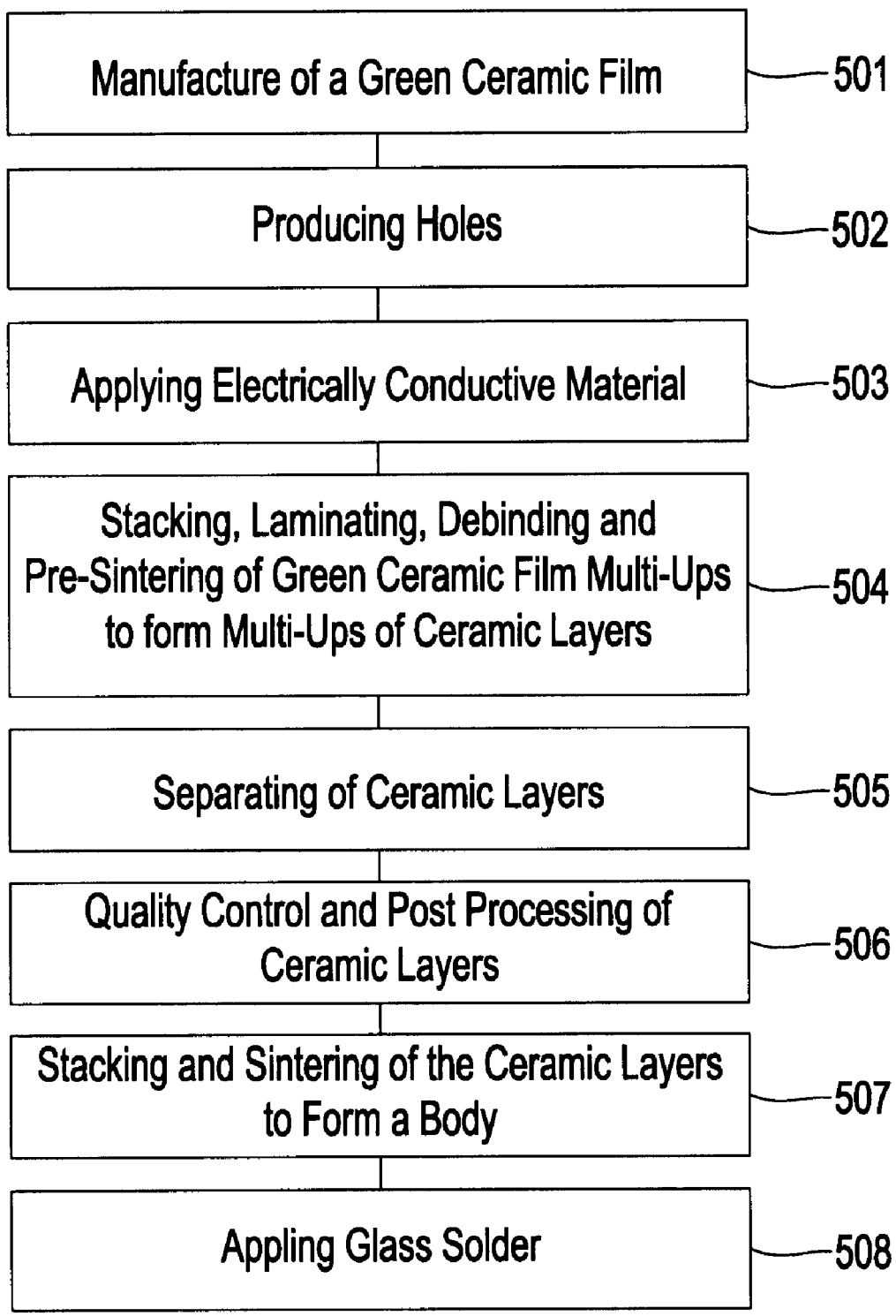
FIG. 5, proceeding from the manufacture of a green ceramic film, shows the critical method steps for manufacturing the device.

The manufacture of an above-described electrode arrangement in a monolithic multi-layer structure advantageously ensues in a multi-up. The critical method steps can be seen with reference to FIG. 5.

First, a green ceramic film containing an organic binding agent is produced (Process 501). The ceramic initial material of glass ceramic having the desired composition is manufactured, for example, in the mixed oxide or sol-gel method. Together with the organic binding agent and water, a slurry is produced from the initial material, the green ceramic film being drawn or cast from said slurry. After drawing, the green films comprise a layer thickness of, for example, 30 through 300 µm.

Figure 6:
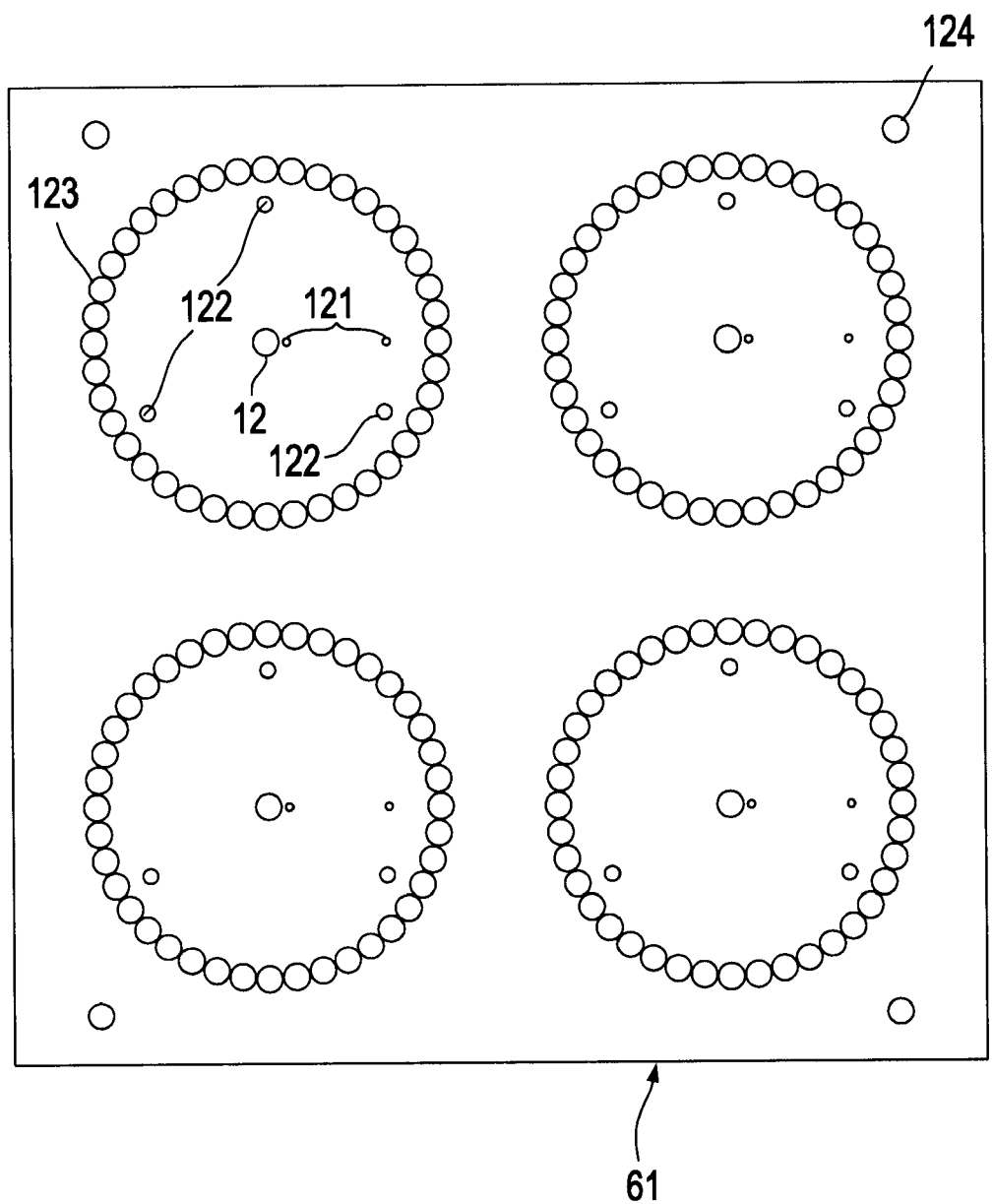
FIG. 6 shows a green ceramic film multi-up with hole structures.

In the next method step 502, holes are produced in the green ceramic film, for example by punching. For a 2×2 multi-up 61, this means that four identical hole combinations are produced in the green film (FIG. 6). One hole combination contains a through aperture 12 through which the electron beam is to be guided, openings 121 with which through-contactings 162 are produced, centering holes 122 and a row 123 of holes that enables the separation of the ceramic layer to be manufactured from the green ceramic film. Centering holes are also produced in the green ceramic film, green ceramic films being stacked on top of one another in the multi-up with the assistance of these centering holes. By way of example, FIG. 6 shows a green film multi-up with hole structures that is needed in the manufacture of the electrode ceramic layer 132.

Figure 7:
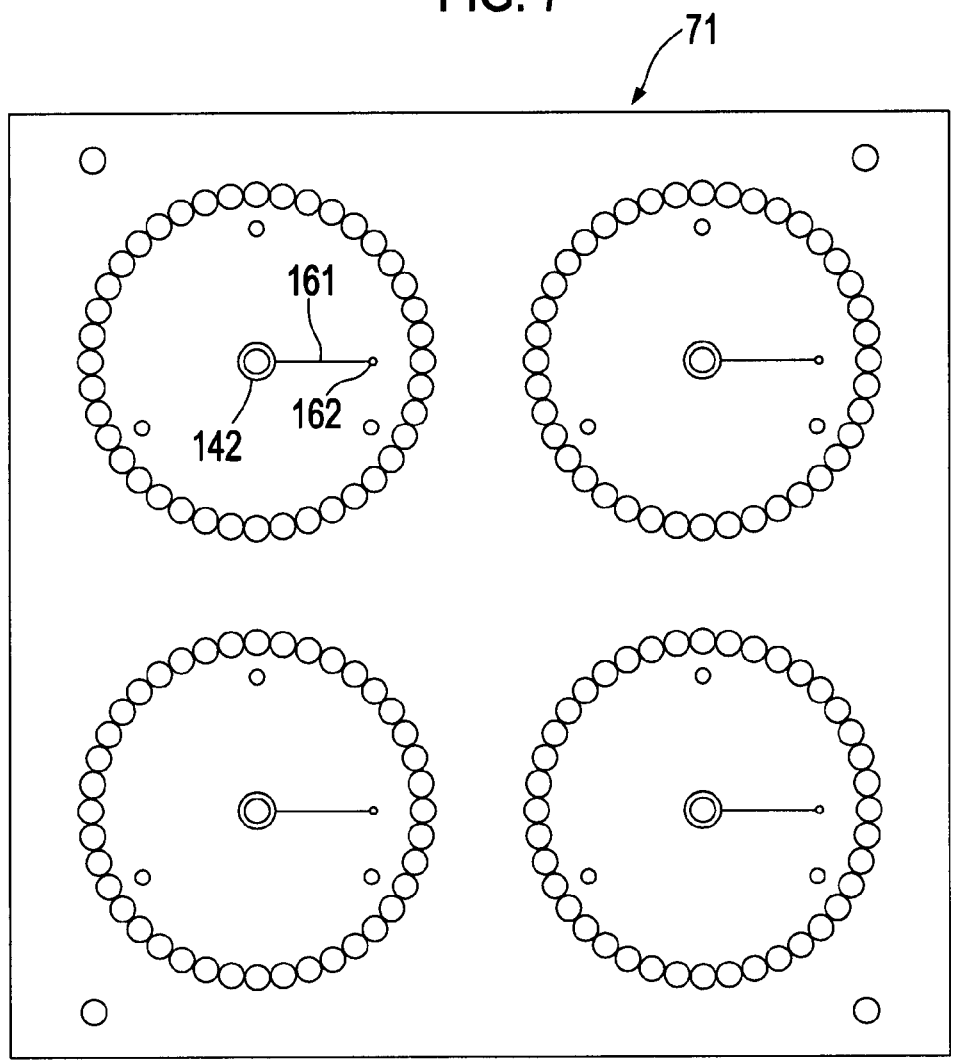
FIG. 7 shows a green ceramic film multi-up with metallizations

In the next step 503, electrodes and/or electrical conductor structures are printed onto the green ceramic film, for example in a silk-screening process. For example, interconnects 161 having a dimension of 100 μm are produced. The electrodes at the four through apertures of the multi-up are applied in the form of rings (FIG. 7).

Insofar as holes for electrical through-contactings are present, these are filled with electrically conductive material in, for example, a stencil printing process. Stencil printing and silk-screening can, for example, be implemented with the same apparatus. FIG. 7 shows the multi-up from FIG. 6 after the metallization steps.

In the following phase (504), green ceramic films are stacked on top of one another in the multi-up in conformity with the functionality of the ceramic layer to be produced and are laminated to form a composite multi-up under single-axis pressure or isostatically. The composite is freed of bonding agent, for example by slowly increasing the temperature to 500° C., and is pre-sintered into multi-ups of ceramic layers. After the de-binding, the pre-sintering of the composite to form a ceramic layer occurs. The sintering temperature $T_s$ lies, for example, 100 K below the sintering temperature of the glass ceramic employed. The sintering substrate during pre-sintering is preferably composed of silicon carbide.

Figure 8:
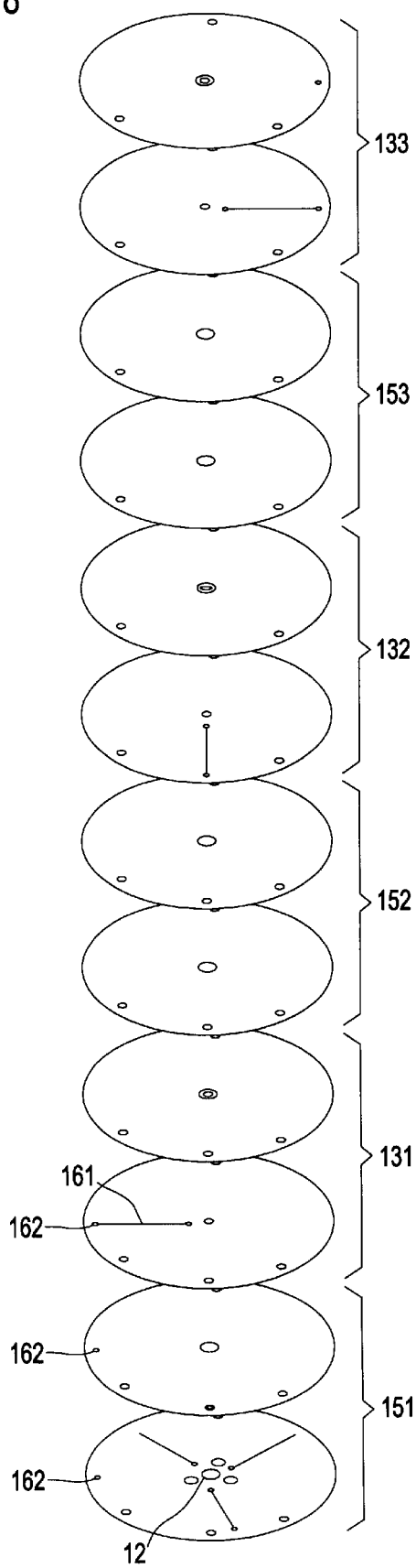
FIG. 8 shows an exploded perspective view onto the green ceramic films in the metallized condition, the device being constructed therefrom.

The electrode ceramic layer 132 is constructed, for example, of two green ceramic films. Accordingly, multi-ups of the respective green ceramic films are stacked on top of one another (FIG. 8). The stacking is based on the centering holes, whereby the hole and conductor structures are applied such in the green ceramic films that the desired, three-dimensional structures (for example, electrical through-contactings) arise from the stacking and subsequent lamination and sintering.

After the pre-sintering, the ceramic layers are separated (505). With the assistance of the hole structures 123, this occurs simply by breaking a ceramic layer out of the ceramic layer multi-up.

After this step, the detached ceramic layers can be subjected to a quality control 506. Faulty ceramic layers can be separated out or, if required error tolerances are adhered to, can be potentially post-processed. The post-processing mainly relates to the post-improvement of electrode opening (for example, by grinding, laser drilling) and grinding off the surface of the ceramic layer. As a result thereof, plane-parallel surfaces of the upper side and underside of the ceramic layers are obtained. The ceramic layer is then distinguished by a defined layer thickness. The post-processing can, for example, also contain grinding off the generated surface of the ceramic body.

Upon employment of a second stacking device, the separated ceramic layers are now stacked on top of one another and sintered together (507) to form the electrode arrangement having monolithic multi-layer structure, being sintered under pressure at the sintering temperature $T_s$ of the glass ceramic.

In order to connect the electrode arrangement to a different ceramic material, for example to the ceramic base of a cathode, glass solder 172 is preferably applied on the underside of the electrode arrangement in the form of a ring (508), preferably in a silk-screening process.

FIG. 8 shows an overview of the layer structure of the electrical arrangement 11 composed of individual green ceramic films. The green ceramic films are shown in their condition after the application of metallizations. Respectively two green ceramic films form a ceramic layer. This also applies to the insulating ceramic layers. The planarization of the ceramic layers is substantially improved by the two-layer structure and, thus, the coaxial alignment of the through apertures of the electrode ceramic layers is greatly simplified. An extremely low-capacitance device is obtained due to the orientation of the interconnects relative to one another.

Although other modifications and changes may be suggested by those skilled in the art, it is the intention of the inventors to embody within the patent warranted hereon all changes and modifications as reasonably and properly come within the scope of their contribution to the art.

I claim:

1. An apparatus for shaping an electron beam comprising:
   a ceramic body in monolithic multi-layer structure having at least one electrode ceramic layer having at least one through aperture for the electron beam:
   at least one electrode arranged at the through aperture, the electrode ceramic layer being glass ceramic; and
   the at least one electrode being an elementary metal.

2. An apparatus according to claim 1, wherein the at least one electrode is annularly arranged around the at least one through aperture.

3. An apparatus according to claim 1, wherein at least two electrodes are successively arranged along a propagation direction of the electron beam.

4. An apparatus according to claim 1, wherein the body includes at least one insulating ceramic layer that has a through aperture for the electron beam.

5. An apparatus according to claim 1, further comprising:
   a plurality of electrode ceramic layers and insulating ceramic layers of the body arranged in alternation along a propagation direction of the electron beam.

6. An apparatus according to claim 1, further comprising:
   at least one second electrode said at least one electrode being electrically insulated from at least one second electrode.

7. An apparatus according to claim 1, further comprising:
   at least one second electrode said at least one electrode being electrically conductively connected to at least one second electrode.

8. An apparatus according to claim 1, wherein the body includes at least one electrical contacting metal.

9. An apparatus according to claim 1, wherein said elementary metal is selected from the group of gold, copper, molybdenum, palladium, platinum, silver and tungsten.

10. An apparatus according to claim 1, further comprising:
    a plurality of electrodes and electrical contactings arranged such that a capacitance arrangement is formed whose capacitances lie below 3 pF.

11. An apparatus according to claim 1, wherein the body is connected by glass solder to a cathode for generating the electron beam.

12. Employment of an apparatus according to claim 1 for intensity modulation and focusing of the electron beam.

13. A method for manufacture of an apparatus for shaping an electron beam comprising the steps of:
    a) fabricating at least two ceramic layers each having at least one through aperture for the electron from a green ceramic film containing a binding agent, at least one of the ceramic layers being fashioned as electrode ceramic layer;
    b) stacking the ceramic layers such upon employment of a first stacking device that through apertures are arranged above one another; and
    c) sintering the ceramic layers to form the body under single-axis pressure and the sintering temperature of the ceramic material employed.

14. A method according to claim 13, wherein said step of fabricating the ceramic layer includes,
   a) producing at least one through aperture in the green ceramic film;
   b) stacking at least two green ceramic films such upon employment of a second stacking device that the through apertures are arranged above one another;
   c) laminating the stacked green ceramic films to form a composite;
   d) freeing the composite of binding agent at elevated temperatures; and
   e) pre-sintering the composite to a ceramic layer at a temperature that lies under the sintering temperature of the ceramic material employed.

15. A method according to claim 13, wherein said step of fabricating the ceramic layer includes manufacture of an electrical through-contacting in the ceramic layer, having
   a) producing at least one contacting opening in at least one green ceramic film, said contacting opening
   b) being filled with electrically conductive material.

16. A method according to claim 14, further comprising the step of:
   applying electrically conductive material on a surface of the ceramic layer following the pre-sintering for fabricating an electrode ceramic layer.

17. A method according to claim 13, further comprising the step of:
   applying electrically conductive material on the surface of at least one green ceramic film for fabricating an electrode ceramic layer.

18. A method according to claim 13, wherein at least one substance from the group of gold, copper, molybdenum, palladium, platinum, silver and/or tungsten is selected as electrically conductive material.

19. A method according to claim 14, wherein for manufacturing the ceramic layer, performing the steps of:
   a) stacking the green ceramic films such on top of one another that the uppermost and the lowest green ceramic film of the composite are ceramic material whose sintering temperature lives above that of the ceramic material that the green ceramic films lying therebetween in the composite; and
   removing the ceramic material sintering at the higher temperature after the pre-sintering.

20. A method according to claim 19, wherein a green ceramic film that includes aluminum oxide is employed as first and last green ceramic film in the stacking.

* * * * *